United States Patent
Shin

(10) Patent No.: US 9,887,381 B2
(45) Date of Patent: Feb. 6, 2018

(54) ORGANIC LIGHT-EMITTING DISPLAY DEVICE WITH ADHESIVE UNIT AND METHOD OF MANUFACTURING THE SAME

(71) Applicant: LG Display Co., Ltd., Seoul (KR)

(72) Inventor: YoungHoon Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/725,047

(22) Filed: May 29, 2015

(65) Prior Publication Data
US 2015/0372254 A1 Dec. 24, 2015

(30) Foreign Application Priority Data
Jun. 20, 2014 (KR) .................. 10-2014-0076006

(51) Int. Cl.
| | |
|---|---|
| *H01L 29/08* | (2006.01) |
| *H01L 35/24* | (2006.01) |
| *H01L 51/00* | (2006.01) |
| *H01L 21/00* | (2006.01) |
| *H01L 51/52* | (2006.01) |
| *H01L 51/56* | (2006.01) |

(52) U.S. Cl.
CPC ...... *H01L 51/5246* (2013.01); *H01L 51/5253* (2013.01); *H01L 51/5259* (2013.01); *H01L 51/56* (2013.01)

(58) Field of Classification Search
CPC .............. H01L 51/5246; H01L 51/524; H01L 51/5253; H01L 51/56; C03C 8/24
USPC ............... 257/E33.059, 100, 99, 40, 88, 79, 257/E51.018, 667; 438/26, 28
See application file for complete search history.

(56) References Cited

U.S. PATENT DOCUMENTS

| | | | |
|---|---|---|---|
| 2007/0172971 A1 | 7/2007 | Boroson | |
| 2007/0173167 A1* | 7/2007 | Choi | ............... H01L 51/5246 445/25 |
| 2009/0066232 A1* | 3/2009 | Koo | ............... H01L 51/5246 313/504 |
| 2010/0141136 A1 | 6/2010 | Yoo et al. | |

(Continued)

FOREIGN PATENT DOCUMENTS

CN 101752276 A 6/2010

OTHER PUBLICATIONS

European Search Report dated Nov. 24, 2015, for European Patent Application No. 15172506.6.

(Continued)

*Primary Examiner* — Lex Malsawma
*Assistant Examiner* — Nduka Ojeh
(74) *Attorney, Agent, or Firm* — Morgan, Lewis & Bockius LLP

(57) ABSTRACT

Provided are an organic light-emitting display device and method of manufacturing the same. An organic light-emitting display device includes: an organic light-emitting unit between two substrates, and an adhesive unit configured to fix the two substrates, the adhesive unit including: a plurality of additives, and at least two regions configured to: suppress infiltration of external moisture into the organic light-emitting unit, and decrease separation of at least one of the two substrates from the adhesive unit caused by the external moisture, and wherein the at least two regions have respective concentrations of the plurality of additives different from each other.

16 Claims, 9 Drawing Sheets

(56) References Cited

U.S. PATENT DOCUMENTS

| | | |
|---|---|---|
| 2010/0148127 A1 | 6/2010 | Ellinger et al. |
| 2011/0133213 A1* | 6/2011 | Lee .................. H01J 7/183 |
| | | 257/79 |
| 2011/0303943 A1* | 12/2011 | Lee ................ H01L 51/5246 |
| | | 257/99 |
| 2012/0112212 A1 | 5/2012 | Kim |
| 2013/0009894 A1* | 1/2013 | Wang ................. G06F 3/041 |
| | | 345/173 |
| 2014/0232258 A1* | 8/2014 | Oh .................. H01L 51/5259 |
| | | 313/504 |
| 2014/0342136 A1* | 11/2014 | Nagao ................. B32B 17/00 |
| | | 428/210 |

OTHER PUBLICATIONS

Chinese Office Action dated Oct. 9, 2016, for Chinese Patent Application No. 201510332979.7.
Office Action issued in corresponding Chinese Patent Application No. 201510332979.7 dated May 31, 2017.

* cited by examiner

ORGANIC LIGHT-EMITTING DISPLAY DEVICE WITH ADHESIVE UNIT AND METHOD OF MANUFACTURING THE SAME

CROSS-REFERENCE TO RELATED APPLICATION(S)

This application claims the benefit and priority of Korean Patent Application No. 10-2014-0076006, filed on Jun. 20, 2014, the entire disclosure of which is hereby incorporated by reference herein for all purposes.

BACKGROUND

1. Technical Field

The present disclosure relates to an organic light-emitting display device and a method of manufacturing the same and, more particularly, to an organic light-emitting display device capable of efficiently protecting an organic light-emitting unit against lateral moisture infiltration by adjusting the distribution of additives contained in an adhesive unit, and a method of manufacturing the same.

2. Discussion of the Related Art

An organic light-emitting diode (OLED) display device is a self-light-emitting display device in which an organic light-emitting layer is disposed between two electrodes. An electron and a hole are respectively injected from the two electrodes into the organic light-emitting layer, and light is emitted by combining the injected electron and hole.

OLED display devices can be classified into a top-emission type, a bottom-emission type, and a dual-emission type, according to emission directions of light, or can be classified into an active matrix type and a passive matrix type, according to the manner in which the OLED display devices are driven.

An organic material and metal material contained in an OLED display device may be very readily oxidized by external factors such as a moisture (e.g., $H_2O$) or oxygen (e.g., $O_2$). That is, the OLED display device may be very sensitive to environmental factors. If moisture or oxygen infiltrates into an organic light-emitting unit, degeneration of an organic emission layer or oxidization of a metal electrode may occur, thereby resulting in various defects such as dark spots or pixel shrinkage and shortened life. Pixel shrinkage refers to a defect darkened from the edge of the pixel because the interface between the metal electrode and the organic emission layer is oxidized or degenerated by moisture infiltration. If pixel shrinkage continues for a long time, it may cause the entire area of a pixel to be tarnished with dark spots, which can seriously affect the reliability of the OLED display device.

To address these problems, various encapsulation methods for preventing moisture or oxygen infiltration have been applied to OLED display devices. For example, side encapsulation using a shield cap formed of metal or glass, top encapsulation using an adhesive layer disposed on the top of an organic light-emitting unit, or hybrid encapsulation, which is a combination of side encapsulation and top encapsulation, may be used.

Among the aforementioned encapsulation methods, hybrid encapsulation employs a filler and a dam member. The filler encapsulates the top of an organic light-emitting unit, and the dam member is disposed outside the filler to minimize lateral infiltration of moisture or oxygen into the organic light-emitting unit. More specifically, the filler for encapsulating the top of the organic light-emitting unit is configured to fill the interior of the OLED display device to protect the organic light-emitting unit against external shock. The dam member disposed outside the filler serves to bond an upper substrate and a lower substrate and to protect the organic light-emitting unit against lateral infiltration of moisture or oxygen. In particular, the dam member has a curable material and additives such as an absorbent reacting with moisture as main components thereof, and can therefore effectively protect the organic light-emitting unit from laterally infiltrating moisture.

However, as the additives contained in the dam member absorb infiltrating moisture from outside, the volume of the additives expands. For example, if calcium oxide (CaO) is used as an additive for the dam member, CaO changes to calcium hydroxide ($Ca(OH)_2$) by reacting with moisture, thereby expanding the volume of the CaO. If the volume of the additive expands by reacting with moisture absorbed into the dam member, cracks may develop in the dam member, which is formed of a curable material. In fact, delamination, which refers to separation of the dam member from the upper substrate or the lower substrate, may occur. Moreover, due to cracks developing in the dam member and delamination, a large amount of moisture or oxygen may infiltrate into the OLED display device, resulting in potentially serious defects, such as dark spots and pixel shrinkage, that lower the reliability of the OLED display device.

In particular, additives positioned closer to the exterior of the dam member absorb moisture or oxygen in the ambient air more quickly, thereby increasing the defects such a cracks and delamination.

SUMMARY

Accordingly, the present disclosure is directed to an organic light-emitting display device and method of manufacturing the same that substantially obviate one or more of the problems due to limitations and disadvantages of the related art. In this regard, present disclosure is directed to an OLED display device having a new structure capable of protecting the organic light-emitting unit against moisture infiltration more effectively in the dam member, and a method of manufacturing the same.

An object of the present disclosure is to provide an OLED display device capable of effectively protecting an organic light-emitting unit against laterally infiltrating moisture or oxygen and minimizing (or reducing) delamination of a substrate from an adhesive unit by distributing additives in the adhesive unit more densely in a particular portion of the adhesive unit.

Additional features and advantages will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided an organic light-emitting display device, including: an organic light-emitting unit between two substrates, and an adhesive unit configured to fix the two substrates, the adhesive unit including: a plurality of additives, and at least two regions configured to: suppress infiltration of external moisture into the organic light-emitting unit, and decrease separation of at least one of the two substrates from the adhesive unit caused by the external moisture, and wherein the at least two regions have respective concentrations of the plurality of additives different from each other.

In another aspect, there is provided an organic light-emitting display device, including: an organic light-emitting unit on a first substrate, an encapsulation unit configured to cover the organic light-emitting unit, a second substrate on the encapsulation unit, and an adhesive unit on outer edges of the first substrate and the second substrate and surrounding the encapsulation unit, the adhesive unit including a plurality of additives, a concentration of the plurality of additives being higher in a particular portion of the adhesive unit than in another portion of the adhesive unit.

In another aspect, there is provided a method of manufacturing an organic light-emitting display device, the method including: providing an organic light-emitting unit on a first substrate, providing an adhesive unit on an outer edge of the first substrate or a second substrate, providing an encapsulation unit on an inner center of the first substrate or of the second substrate, and bonding the first substrate and the second substrate, wherein the providing of the adhesive unit includes providing a curable resin on the outer edge of the first substrate or the second substrate using a plurality of nozzles, and wherein at least one of the nozzles is configured to provide a plurality of additives.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
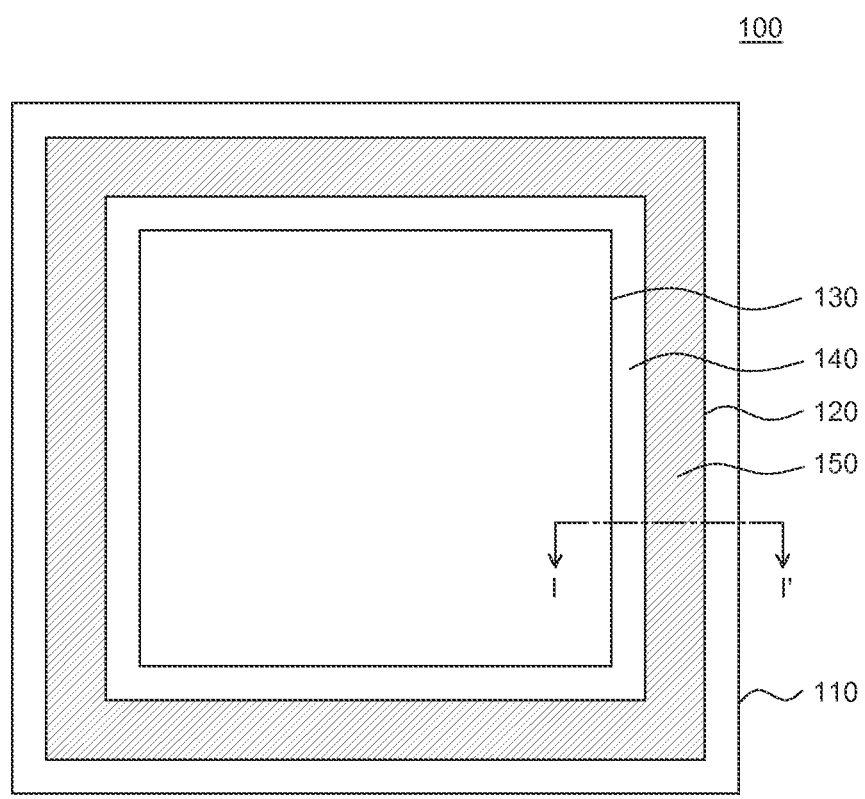
FIG. 1 is a plan view of an OLED display device according to an embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 2:
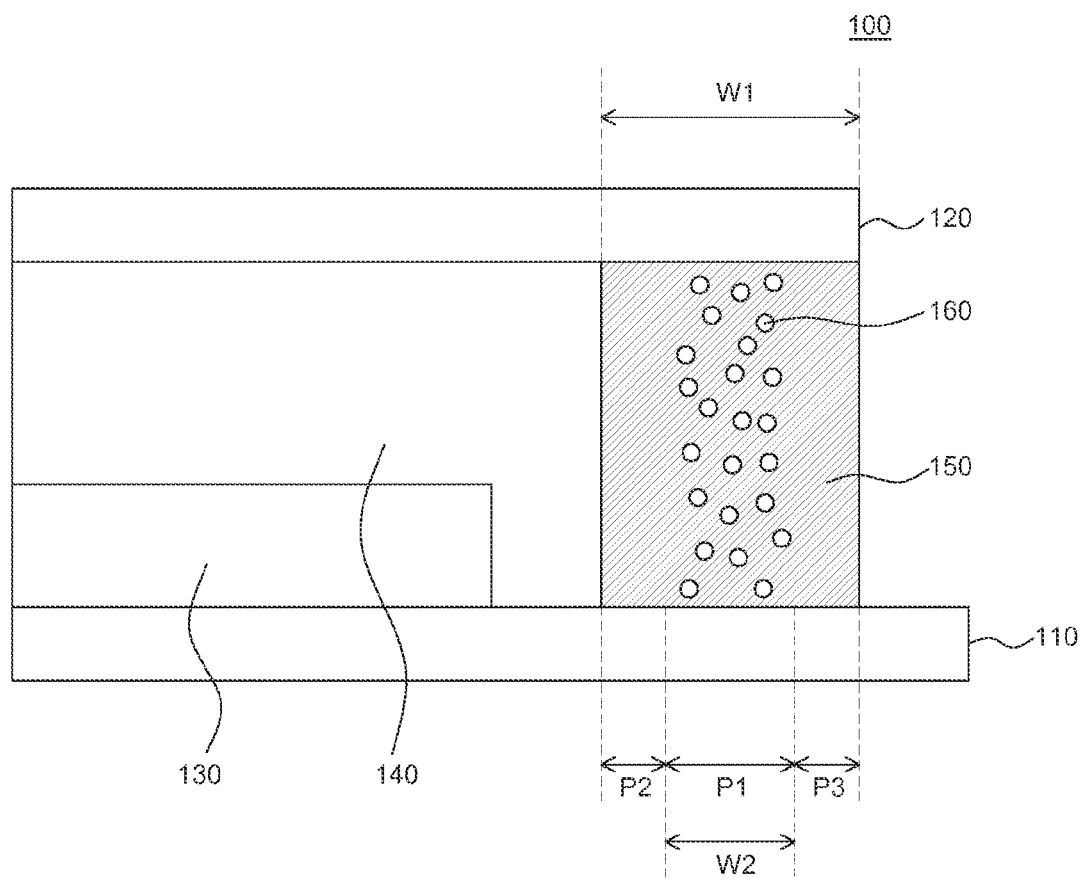
FIG. 2 is a cross-sectional view of the OLED display device, taken along line I-I' of FIG. 1.

FIG. 1 is a plan view of an OLED display device 100 according to an embodiment. FIG. 2 is a cross-sectional view of the OLED display device, taken along line I-I' of FIG. 1.

The OLED display device 100 may include a first substrate 110, a second substrate 120, an organic light-emitting unit 130, an encapsulation unit 140, and an adhesive unit 150 including a plurality of additives 160.

With reference to the FIG. 2 example, the organic light-emitting unit 130 and the encapsulation unit 140, which covers the organic light-emitting unit 130, may be positioned on the first substrate 110, and the second substrate 120 may be positioned on the encapsulation unit 140. In addition, the adhesive unit 150 including the plurality of additives 160 may be positioned on the outer edges of the first substrate 110 and the second substrate 120. The adhesive unit 150 may surround the encapsulation unit 140, as shown in the FIG. 1 example.

The first substrate 110 and the second substrate 120 may be formed, e.g., of glass, metal, or plastic. For example, if the OLED display device 100 is of the top-emission type, light emitted from the organic light-emitting unit 130 may be transmitted towards the second substrate 120. In this case, the second substrate 120 may be formed, e.g., of transparent glass or plastic. On the other hand, if the OLED display device 100 is of the bottom-emission type, light emitted from the organic light-emitting unit 130 may be transmitted towards the first substrate 110. In this case, the first substrate 110 may be formed, e.g., of transparent glass or plastic, and the second substrate 120 may be formed, e.g., of metal. However, embodiments are not limited thereto.

The first substrate 110 may protrude more than the second substrate 120. A pad unit and a circuit unit (which are not shown) for supplying various signals to the organic light-emitting unit 130 may be disposed on the protruding portion of the first substrate 110.

The organic light-emitting unit 130 may be positioned on the first substrate 110. The organic light-emitting unit 130 may include two electrodes and an organic emission layer disposed therebetween. The organic emission layer may have a single emission layer structure, e.g., for emitting a monochromatic light, or may include a plurality of emission layers, e.g., for emitting white light.

The encapsulation unit 140 may be disposed on the organic light-emitting unit 130. The encapsulation unit 140 may be disposed to cover the organic light-emitting unit 130. The encapsulation unit 140 may serve not only to encapsulate the organic light-emitting unit 130, but also to attenuate external shock transferred to the organic light-emitting unit 130.

The encapsulation unit 140 may be formed through polymerization, e.g., by applying a fluidic monomer material as a filler and by curing the same with light or heat. For example, the monomer material may be curable in a visible radiation region of the spectrum, e.g., in a wavelength range of 380 nm to 800 nm. If the encapsulation unit 140, which may be applied to the upper side of the organic light-emitting unit 130, is cured by radiating light in the ultraviolet radiation region of the spectrum onto the encapsulation unit 140, the light may damage the organic light-emitting unit 130. In one example, when heat is used to cure the encapsulation unit 140, a material that is curable at a temperature that does not damage the organic light-emitting unit 130, e.g., a temperature below 150° C., may be used as the monomer material. In another example, a nonvolatile material that does not react with environmental factors such as air and moisture may be used for the encapsulation unit 140.

The encapsulation unit 140, that may be formed into a polymer by curing a material, may be in the gel or semisolid state, which is an intermediate state between the liquid and solid states. The encapsulation unit 140 may be disposed to cover the organic light-emitting unit 130, and may absorb external shock to protect the organic light-emitting unit 130.

The encapsulation unit 140 may be formed of, e.g., one of or a combination of an imidazole derivative, an oxime derivative, an organic peroxide, and a ketone. The encapsulation unit 140 may be manufactured in a polymer form by curing the aforementioned monomer materials with light or heat. Alternatively, the encapsulation unit 140 may be formed of one of or a combination of a polyimide-based material, a bisphenol-based material, and a fluorine-based material, but is not limited thereto.

The adhesive unit 150 may be positioned on the outer edges of the first substrate 110 and the second substrate 120. The adhesive unit 150 may include a plurality of additives. As shown in the FIG. 1 example, the adhesive unit 150 may surround the encapsulation unit 140. The adhesive unit 150 may serve to bond the first substrate 110 and the second substrate 120, and may protect the organic light-emitting unit 130 against laterally infiltrating moisture or oxygen.

The base material of the adhesive unit 150 may be, e.g., a thermosetting resin or a photopolymer resin. For example, the base material may include an epoxy-based polymer and an olefin-based polymer, but embodiments of the present disclosure are not limited thereto.

The adhesive unit 150 may include a plurality of additives 160. The additives 160 may absorb moisture or oxygen introduced into the adhesive unit 150, e.g., by chemically reacting with moisture or oxygen.

The plurality of additives 160 may be moisture absorbent and may include, for example, one of or at least two mixtures of metal powder, such as alumina, a metal oxide, a metal salt, and phosphorus pentoxide ($P_2O_5$). Examples of the metal oxide may include lithium oxide ($Li_2O$), sodium oxide ($Na_2O$), barium oxide (BaO), calcium oxide (CaO), and magnesium oxide (MgO). Examples of the metal salt may include sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate (NiSO4). Moreover, examples of the metal salt may include a metal halide, such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide (e.g., $SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO4)_2$), or magnesium perchlorate ($Mg(ClO4)_2$). Embodiments of the present disclosure are not limited to these examples.

The plurality of additives 160 may be more densely distributed in a particular part of the adhesive unit 150. That is, the plurality of additives 160 may not be just mixed with a resin used as a base material of the adhesive unit 150, but may be intentionally disposed to be more densely distributed in a particular part. In other words, the plurality of additives 160 may not be uniformly distributed throughout the adhesive unit 150, but may be distributed to be denser in a particular part than in another part of the adhesive unit 150. In one example, the plurality of additives 160 may be densely distributed in a part of the adhesive unit 150 that is not close to the exterior of the adhesive unit 150. "Dense distribution" of the plurality of additives 160 in a particular part of the adhesive unit 150 means that concentration of the plurality of additives 160 is higher in the particular part of the adhesive unit 150 than in another part of the adhesive unit 150.

As mentioned above, the volume of the plurality of additives 160 may expand as the plurality of additives 160 absorbs laterally infiltrating oxygen or moisture. For example, the additives positioned closer to the exterior of the adhesive unit 150 may more quickly absorb moisture or oxygen in the air. As a result, cracks may develop in the adhesive unit 150 due to expansion of the volume of the additives 160, which may weaken adhesion between the adhesive unit 150 and the first and second substrates 110, 120, and may cause delamination. The defect of delamination of the substrates may cause a large amount of moisture and oxygen to be introduced into the organic light-emitting unit 130, leading to serious defects, such as dark spots and pixel shrinkage, and may also lower the reliability and life of the OLED display device 100.

The OLED display device 100 may allow a plurality of additives 160 to be densely distributed in a particular part of the adhesive unit 150. Thus, the OLED display device 100 may protect the organic light-emitting unit 130 against laterally infiltrating moisture or oxygen, and may reduce or minimize delamination of the first and second substrates 110, 120 from the adhesive unit 150.

The plurality of additives 160 may be most densely distributed at the center portion of the adhesive unit 150 of the OLED display device 100. That is, the center portion of the adhesive unit 150 may have the highest concentration of the plurality of additives 160 in the adhesive unit 150. As shown in the FIG. 2 example, the adhesive unit 150 may include a first portion P1 positioned at the center portion of the adhesive unit 150, a second portion P2 positioned inside the first portion P1 and closer to the organic light-emitting unit 130, and a third portion P3 positioned outside the first portion P1 and closer to the exterior of the adhesive unit 150. In one example, the plurality of additives 160 may be densely distributed in the first portion P1 positioned at the center portion of the adhesive unit 150.

As the plurality of additives 160 may be densely distributed in the first portion P1 of the adhesive unit 150, it may laterally absorb introduced moisture or oxygen, minimizing (or reducing) infiltration of moisture or oxygen into the organic light-emitting unit 130. That is, because the plurality of additives 160 distributed in the first portion P1 may serve as a moisture barrier, the organic light-emitting unit 130 may be protected. Thus, the first portion P1 may be referred to as a "moisture barrier region."

A minimum amount (or none) of the plurality of additives 160 may be disposed in the third portion P3 positioned on the outermost side of the adhesive unit 150. The third portion P3 may serve to maintain adhesion between the adhesive unit 150 and the first substrate 110, and between the adhesive unit 150 and the second substrate 120. That is, the third portion P3 may serve to suppress or retard a fast reaction between the plurality of additives 160 distributed in the adhesive unit 150 and moisture or oxygen in the air, and may reduce or minimize delamination of the first substrate 110 or the second substrate 120 from the adhesive unit 150. Thus, the third portion P3 may be referred to as a "delamination suppression region."

Similarly, a minimum amount (or none) of the plurality of additives 160 may be disposed in the second portion P2 positioned on the inner side of the adhesive unit 150. The second portion P2 may serve to maintain adhesion between the adhesive unit 150 and the first substrate 110, and between the adhesive unit 150 and the second substrate 120. Thus, the second portion P2 may also be referred to as a "delamination suppression region," as with the third portion P3.

In addition, as shown in the example of FIG. 2, the width W2 of the first portion P1 of the adhesive unit 150 may be less than or equal to about 50% of the overall width W1 of the adhesive unit 150. That is, by configuring the adhesive unit 150, such that the sum of the widths of the second portion P2 and the third portion P3 is greater than or equal to about 50% of the overall width W1, adhesion between the adhesive unit 150 and the first substrate 110, and between the adhesive unit 150 and the second substrate 120, may be maintained. In addition, by configuring the adhesive unit 150, such that the width of the second portion P2 is equal to that of the third portion P3, e.g., the second portion P2 and the third portion P3 may be symmetrically provided with respect to the first portion P1 in terms of width, adhesion between the adhesive unit 150 and the first substrate 110 and between the adhesive unit 150 and the second substrate 120 may be effectively maintained in a balanced manner. However, embodiments of the present disclosure are not limited thereto. In consideration of the design and design factor of the OLED display device 100, the adhesive unit 150 may be configured, e.g., such that the width of the third portion P3 positioned on the outer side of the adhesive unit 150 is greater than the width of the second portion P2 positioned on the inner side of the adhesive unit 150. Thus, reaction between the plurality of additives 160 and moisture or oxygen in the air may be further suppressed or retarded.

The plurality of additives 160 may be distributed in the adhesive unit 150 so that the additives 160 may be most densely distributed at the center portion of the adhesive unit 150, or that the density thereof may gradually decrease from the center portion of the adhesive unit 150 to an edge portion of the adhesive unit 150, e.g., to the inner edge or outer edge of the adhesive unit 150. In other words, the concentration of the plurality of additives 160 may gradually decrease from the center portion of the adhesive unit 150 to the edges of the adhesive unit 150.

In some embodiments, as shown in the FIG. 2 example, the plurality of additives 160 included in the first portion P1 may be distributed throughout the first portion P1, and may decrease in a horizontal direction toward the second portion P2 or toward the third portion P3. For example, the density of the additives 160 may gradually decrease from the center portion of the adhesive unit 150 to an edge thereof in the horizontal direction, and the additives 160 may be distributed evenly in the vertical direction, such that the plurality of additives 160 may function as a moisture barrier, e.g., a wall for minimizing (or reducing) moisture infiltration.

Accordingly, by configuring the OLED display device 100 such that the plurality of additives 160 is intentionally densely distributed in the first portion P1, e.g., the center portion of the adhesive unit 150, the amount of the plurality of additives 160 disposed close to the exterior of the device may be reduced or minimized. As such, the adhesive unit 150 may effectively protect the organic light-emitting unit 130 against laterally infiltrating oxygen or moisture, and may contribute to maintaining adhesion between the adhesive unit 150 and the first and second substrates 110, 120.

FIGS. 3A to 3D are graphs schematically depicting distribution of a plurality of additives in an adhesive unit of an OLED display device according to an embodiment. The examples of FIGS. 3A to 3D illustrate distribution of a plurality of additives in an adhesive unit including a first portion P1 positioned at the center portion of the adhesive unit, a second portion P2 positioned on the inner side of the adhesive unit, and a third portion P3 positioned on the outer side of the adhesive unit, as shown in the example of FIG. 2. In the OLED display device illustrated in the examples of FIGS. 3A to 3D, distribution of a plurality of additives in the adhesive unit may be adjusted by the processing conditions in the manufacturing process of the adhesive unit. Details of the manufacturing process will be described below with reference to FIGS. 6 and 7A-7B.

Figure 3A:
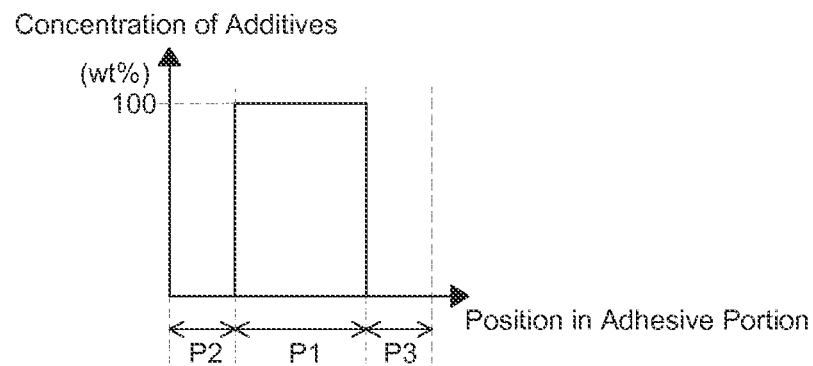
FIGS. 3A to 3D are graphs depicting distribution of a plurality of additives in an adhesive unit of an OLED display device according to an embodiment.

FIG. 3A illustrates an example in which a plurality of additives (e.g., the plurality of additives 160 of FIG. 2) may be disposed only in the first portion P1, which is the center portion of an adhesive unit (e.g., the adhesive unit 150 of FIG. 2). When the concentration of all additives included in the adhesive unit is 100 wt % (weight percent), the additives with a concentration of 100 wt % may be densely distributed in the first portion P1 of the adhesive unit, as shown in the FIG. 3A example. In one example, the width of the first portion P1 may be less than or equal to about 50% of the overall width of the adhesive unit. The adhesive unit illustrated in FIG. 3A may have the most mathematically ideal distribution of the plurality of additives among the examples illustrated in FIGS. 3A to 3D.

Figure 3B:
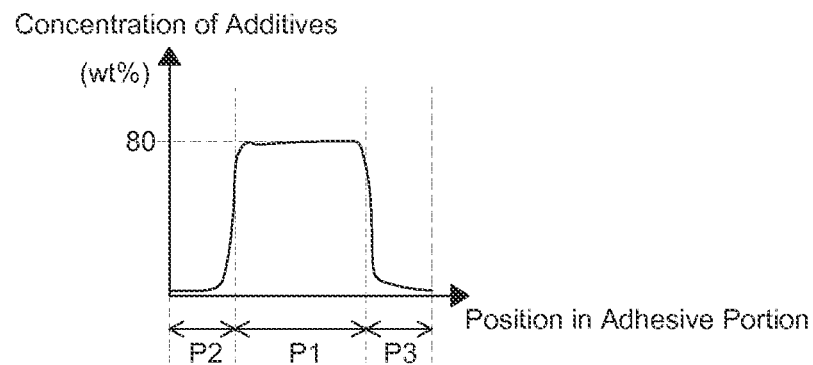

FIG. 3B illustrates an example in which a plurality of additives may be distributed such that the concentration thereof in the first portion P1 of the adhesive unit is about 80 wt %. It can be seen from the FIG. 3B example that the remaining additives corresponding to about 20 wt % may be distributed in the second portion P2 and the third portion P3, and the concentration of the plurality of additives may gradually decrease from the center portion of the adhesive unit to both edges of the adhesive unit. This means that the density of the plurality of additives may gradually decrease from the center portion of the adhesive unit to the edges of the adhesive unit. Herein, the width of the first portion P1 may be less than or equal to about 50% of the overall width of the adhesive unit. The example illustrated in FIG. 3B may represent a more practical distribution of the plurality of additives in the adhesive unit which can be implemented by reflecting the processing conditions and environment.

Figure 3C:
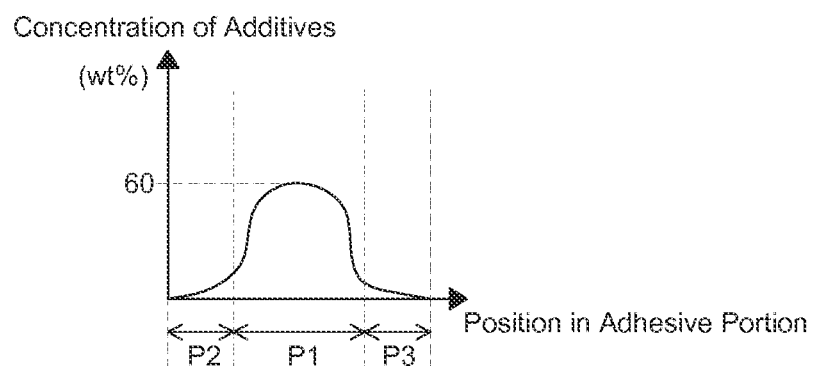

FIG. 3C illustrates an example distribution of a plurality of additives over the first portion P1, second portion P2, and third portion P3 of the adhesive unit, which may be similar to a normal distribution. For example, a plurality of additives may be distributed such that more than about 60 wt % of the additives may be distributed in the first portion P1, and the remaining additives may be distributed over the second portion P2 and the third portion P3. For example, the density of the plurality of additives may gradually decrease from the center portion of the adhesive unit to the edges of the adhesive unit, and the width of the first portion P1 may be less than or equal to about 50% of the overall width of the adhesive unit.

Figure 3D:
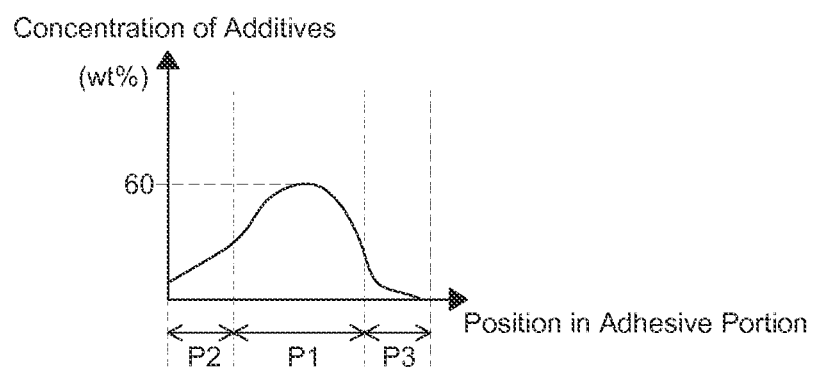

FIG. 3D illustrates an example distribution of a plurality of additives of which more than about 60 wt % is distributed in the first portion P1 of the adhesive unit, as in the example illustrated in FIG. 3C. FIG. 3D illustrates that the concentration of the additives may be higher in the second portion P2 corresponding to the inner portion of the adhesive unit than in the third portion P3 corresponding to the outer portion of the adhesive unit. The example of FIG. 3D may correspond to a structure enhancing the function of protecting the organic light-emitting unit against laterally infiltrating moisture or oxygen. For example, when the total amount of the additives is increased, the function of addressing moisture infiltration may be enhanced by injecting more additives into the second portion P2 corresponding to the inner portion of the adhesive unit.

As can be seen from the examples of FIGS. 3A to 3D, the concentration of the plurality of additives may be higher in a particular part of the adhesive unit than in another part of the adhesive unit. For example, the concentration of the plurality of additives may be higher in the first portion corresponding to the center portion of the adhesive unit than in the second and third portions respectively corresponding to the inner and outer portions of the adhesive unit. In addition, the adhesive unit may be configured so that the center portion of the adhesive unit has the highest concentration of the plurality of additives, and the concentration gradually decreases from the center to the edges of the adhesive unit.

Accordingly, by configuring the OLED display device with the plurality of additives being densely distributed at the center of the adhesive unit, e.g., such that at least about 60 wt % of the total amount of the additives is disposed at the center of the adhesive unit, the organic light-emitting unit may be protected against laterally infiltrating moisture or oxygen, and delamination of the substrates from the adhesive unit may be reduced or minimized. As such, defects caused by moisture infiltration, such as dark spots and pixel shrinkage, may be reduced, and the reliability and the lifespan of the OLED display device may be enhanced.

Figure 4:
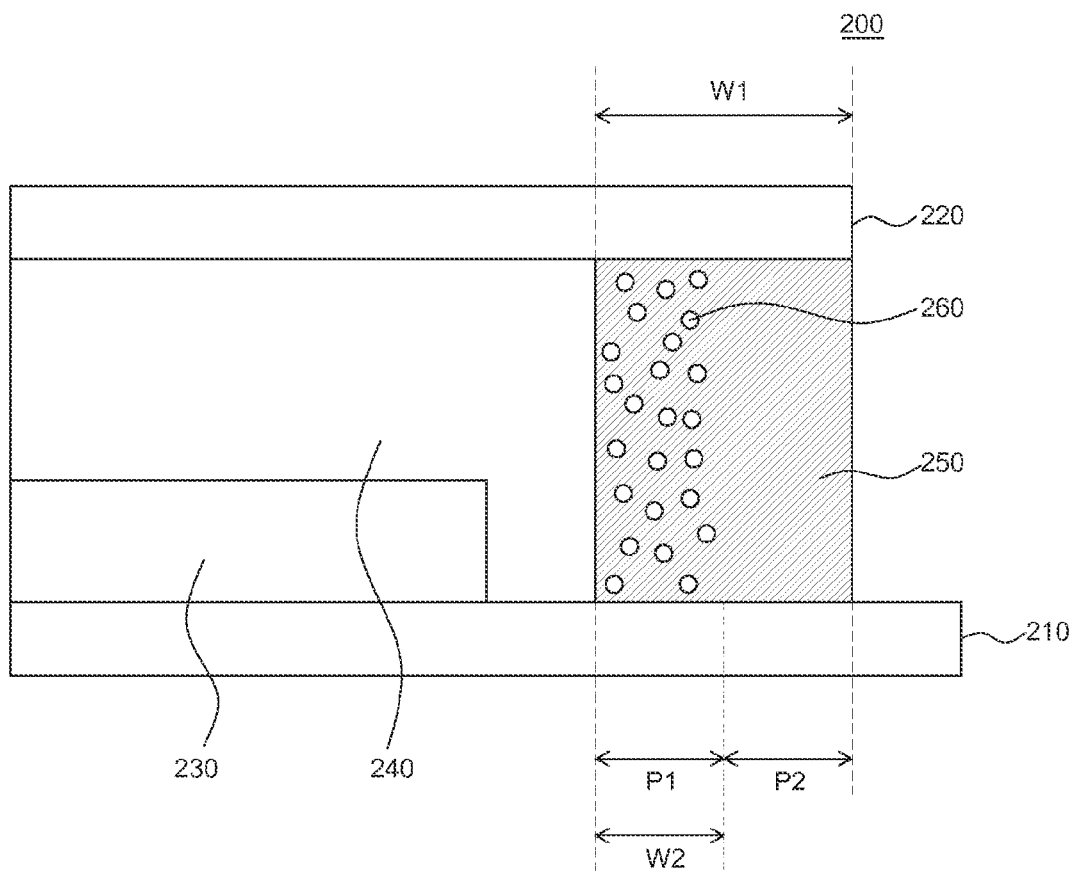
FIG. 4 is a cross-sectional view of an OLED display device according to an embodiment.

FIG. 4 is a cross-sectional view of an OLED display device 200 according to an embodiment. In the description of FIG. 4, elements substantially similar to or corresponding to elements previously described will not be described again in detail. That is, with reference to the example of FIG. 4, a first substrate 210, a second substrate 220, an organic light-emitting unit 230, and an encapsulation unit 240 may be substantially similar, respectively, to the first substrate 110, the second substrate 120, the organic light-emitting unit 130, and the encapsulation unit 140 that are illustrated in the FIG. 2 example.

In the OLED display device 200, a plurality of additives 260 may be most densely distributed in an inner portion of an adhesive unit 250. That is, concentration of the plurality of additives 260 may be highest in the inner portion of the adhesive unit 250, the inner portion being closer to the organic light-emitting unit 230. As shown in the FIG. 4 example, the adhesive unit 250 may include a first portion P1 positioned on the inner side (closer to the organic light-emitting unit 230) of the adhesive unit 250 and a second portion P2 positioned on the outer side of the adhesive unit 250. The plurality of additives 260 may be densely distributed in the first portion P1.

As the plurality of additives 260 may be densely distributed in the first portion P1 of the adhesive unit 250, the first portion P1 may serve to absorb laterally introduced moisture or oxygen, minimizing (or reducing) infiltration of moisture or oxygen into the organic light-emitting unit 230. That is, because the plurality of additives 260 distributed in the first portion P1 may function as a moisture barrier, the organic light-emitting unit 230 may be protected. Therefore, the first portion P1 may be referred to as a "moisture barrier region."

A minimum amount (or none) of the plurality of additives 260 may be disposed in the second portion P2 positioned on the outer side of the adhesive unit 250. Thus, the second portion P2 may maintain adhesion between the adhesive unit 250 and the first substrate 210, and between the adhesive unit 250 and the second substrate 220. That is, the second portion P2 may suppress or retard reaction between the plurality of additives 260 distributed in the adhesive unit 250 and moisture or oxygen in the air, and may reduce or minimize delamination of the first substrate 210 or the second substrate 220 from the adhesive unit 250. Thus, the second portion P2 may be referred to as a "delamination suppression region." For example, as shown in the example of FIG. 4, the width W2 of the first portion P1 of the adhesive unit 250 may be less than or equal to about 50% of the overall width W1 of the adhesive unit 250. As such, adhesion between the adhesive unit 250 and the first substrate 210, and between the adhesive unit 250 and the second substrate 220, may be maintained.

The plurality of additives 260 included in the adhesive unit 250 may be most densely distributed in the inner portion of the adhesive unit 250, and the density of the plurality of additives 260 may gradually decrease from the inner portion of the adhesive unit 250 to the outer portion of the adhesive unit 250. That is, the concentration of the plurality of additives 260 may be highest in the inner portion of the adhesive unit 250, and may gradually decrease from the inner portion of the adhesive unit 250 to the outer portion of adhesive unit 250. In some embodiments, with reference to the example illustrated FIG. 4, the plurality of additives 260 included in the first portion P1 may be distributed throughout the first portion P1. For example, the density of the additives 260 may gradually decrease away from the inner side of the adhesive unit 250 in the horizontal direction, where a horizontal direction points from the first portion P1 to the second portion P2. Further, the additives 260 may be distributed evenly in the vertical direction, such that the plurality of additives 260 may function as a moisture barrier, e.g., a wall minimizing (or reducing) moisture infiltration.

Accordingly, by configuring the OLED display device 200 so that the plurality of additives 260 is intentionally densely distributed in the first portion P1, e.g., the inner portion, the plurality of additives 260 may be positioned as far from the exterior of the device as possible. As such, the adhesive unit 250 may effectively protect the organic light-emitting unit 230 against laterally infiltrating oxygen or moisture, and may contribute to maintaining adhesion between the adhesive unit 250 and the first and second substrates 210, 220.

Figure 5A:
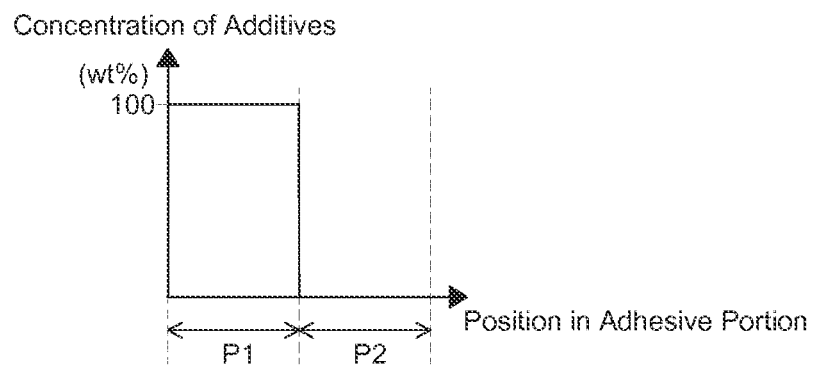
FIGS. 5A to 5C are graphs depicting distribution of a plurality of additives in an adhesive unit of an OLED display device according to an embodiment.
Figure 5B:
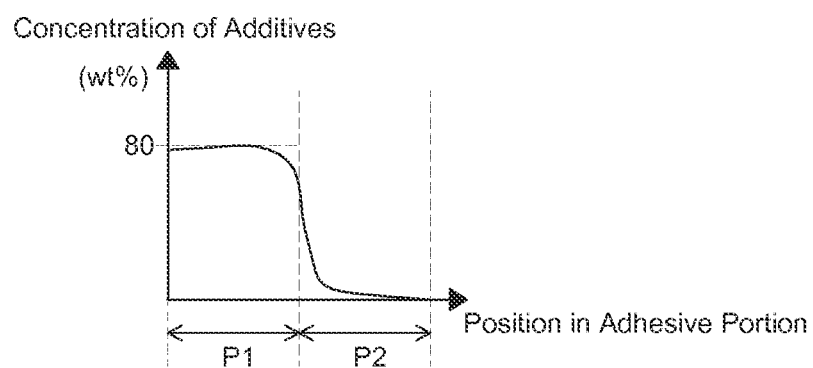
Figure 5C:
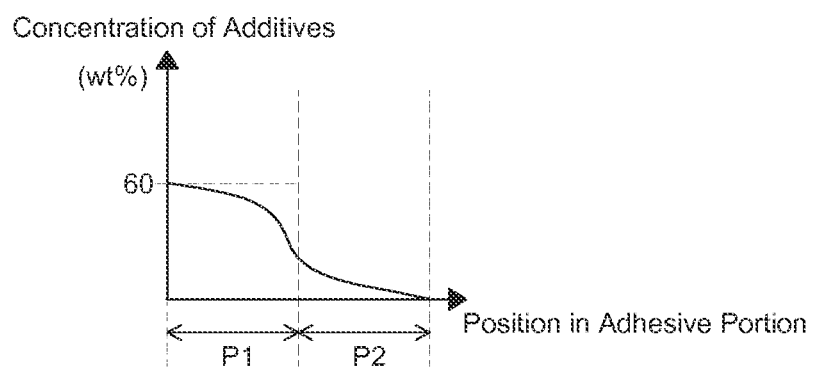

FIGS. 5A to 5C are graphs schematically depicting distribution of a plurality of additives in an adhesive unit of an OLED display device according to an embodiment. The examples of FIGS. 5A to 5C illustrate distribution of a plurality of additives according to positions in an adhesive unit including a first portion P1 positioned on the inner side and a second portion P2 positioned on the outer side as shown in the example of FIG. 4. In the OLED display device illustrated in the examples of FIGS. 5A to 5C, distribution of a plurality of additives in the adhesive unit may be adjusted by the processing conditions in the manufacturing process of the adhesive unit.

FIG. 5A illustrates an example in which a plurality of additives (e.g., the plurality of additives 260 of FIG. 4) may be disposed only in the first portion P1, which is the inner portion of an adhesive unit (e.g., the adhesive unit 250 of FIG. 4). When the concentration of all additives contained in the adhesive unit is 100 wt %, the additives with a concentration of 100 wt % may be densely distributed in the first portion P1 of the adhesive unit, as shown in the FIG. 5A example. In one example, the width of the first portion P1 may be less than or equal to about 50% of the overall width of the adhesive unit. The adhesive unit illustrated in FIG. 5A may have the most mathematically ideal distribution of the plurality of additives among the examples illustrated in FIGS. 5A to 5C.

FIG. 5B illustrates an example in which a plurality of additives may be distributed such that the concentration thereof in the first portion P1, which is the inner portion of the adhesive unit, is about 80 wt %. It can be seen from the FIG. 5B example that the remaining additives corresponding to about 20 wt % may be distributed in the second portion P2, and the concentration of the plurality of additives may gradually decrease from the inner portion of the adhesive unit to the outer portion of adhesive unit. This means that the density of the plurality of additives may gradually decrease from the inner portion of the adhesive unit to the outer portion of adhesive unit. Herein, the width of the first portion P1 may be less than or equal to about 50% of the overall width of the adhesive unit. The example illustrated in FIG. 5B may represent a more practical distribution of the plurality of additives in the adhesive unit which can be implemented by reflecting the processing conditions and environment.

FIG. 5C illustrates an example in which more than about 60 wt % of the plurality of additives may be distributed in the first portion P1, and the remaining additives may be distributed in the second portion P2. For example, the density of the plurality of additives may gradually decrease from the inner portion of the adhesive unit to the outer portion of the adhesive unit. The width of the first portion P1 may be less than or equal to about 50% of the overall width of the adhesive unit.

As can be seen from the examples of FIGS. 5A to 5C, the concentration of the plurality of additives may be higher in a particular part of the adhesive unit than in another part of the adhesive unit. For example, the concentration of the plurality of additives may be higher in the first portion corresponding to the inner portion of the adhesive unit than in the second portion corresponding to the outer portion of the adhesive unit. In addition, the adhesive unit may be configured so that the inner portion of the adhesive unit has the highest concentration of the plurality of additives and the concentration gradually decreases from the inner portion to the outer portion of the adhesive unit.

Accordingly, by configuring the OLED display device with the plurality of additives being densely distributed in the inner portion of the adhesive unit, e.g., such that at least about 60 wt % of the total amount of the additives is disposed in the inner portion of the adhesive unit, the organic light-emitting unit may be protected against laterally infiltrating moisture or oxygen, and delamination of the substrates from the adhesive unit may be reduced or minimized. As such, defects caused by moisture infiltration, such as dark spots and pixel shrinkage, may be reduced, and the reliability and the lifespan of the OLED display device may be enhanced.

Figure 6:
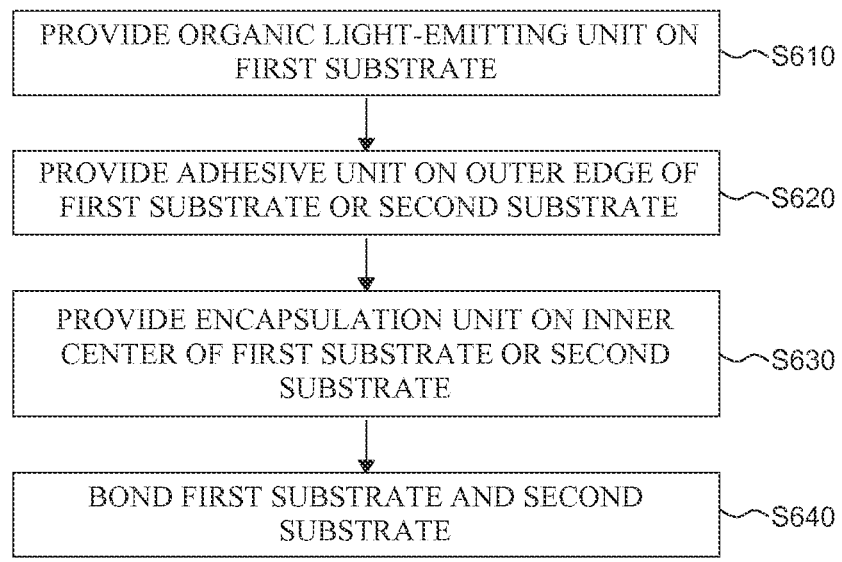
FIG. 6 is a flowchart illustrating a method of manufacturing an OLED display device according to an embodiment.
Figures 7A, 7B:
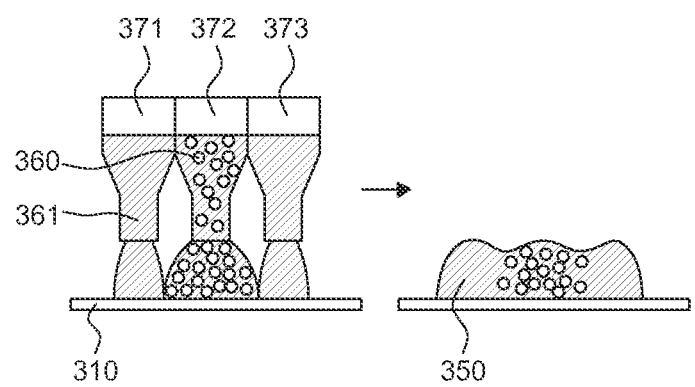
FIGS. 7A and 7B illustrate a process of manufacturing an adhesive unit of an OLED display device according to an embodiment.

FIG. 6 is a flowchart illustrating a method of manufacturing an OLED display device according to an embodiment. FIGS. 7A and 7B illustrate a process of manufacturing an adhesive unit of the OLED display device according to an embodiment. The examples of FIGS. 7A and 7B illustrate a manufacturing process for providing the adhesive unit of the OLED display device shown in the FIG. 2 example, with a detailed description of forming an adhesive unit using the manufacturing method of FIG. 6 (e.g., operation S620).

The method of manufacturing an OLED display device may include providing (e.g., forming) an organic light-emitting unit on a first substrate (operation S610), providing (e.g., forming) an adhesive unit on the outer edges of the first substrate or a second substrate (operation S620), providing (e.g., forming) an encapsulation unit on an inner center of the first substrate or the second substrate (operation S630), and bonding the first substrate and the second substrate (operation S640).

First, an organic light-emitting unit may be provided on the first substrate (operation S610). The organic light-emitting unit may include an anode, an organic emission layer, and a cathode. The organic light-emitting unit may be formed, e.g., using a commonly known manufacturing method.

Next, an adhesive unit may be formed on the outer edge of the first substrate or second substrate (operation S620). A process of manufacturing the adhesive unit formed on the first substrate will be described with reference to FIGS. 7A and 7B below.

Forming the adhesive unit (operation S620) includes providing a curable resin on the outer edge of the first substrate using a plurality of depositing units, e.g., nozzles. In one example, at least one of the nozzles may include a plurality of additives. For example, with reference to FIG. 7A, a curable resin 361 may be formed on the outer edge of a first substrate 310 using, e.g., three nozzles 371, 372, 373. In some embodiments, the second nozzle 372 positioned at the center may provide a plurality of additives 360 in addition to the curable resin 361. That is, the second nozzle 372 supplying the curable resin 361, including the plurality of additives 360, may form a first portion corresponding to the center portion of the adhesive unit, and the first nozzle 371 and the third nozzle 373 disposed on both sides of the second nozzles 372 may respectively supply only the curable resin 361 to form a second portion corresponding to the inner portion of the adhesive unit and a third portion corresponding to the outer portion of the adhesive unit.

As shown in the FIG. 7B example, the curable resin 361 supplied from the three nozzles 371, 372, 373 of FIG. 7A may be cured, e.g., by heat or light. In one example, the plurality of additives 360 injected only into the center may slowly move, e.g, flow, to both sides of the center according to the curing time and processing conditions. While distribution of the plurality of additives 360 may be adjusted by adjusting processing conditions such as the properties of a material used as the curable resin and the curing time, the additives may be adjusted so that at least about 60 wt % of the whole additives injected through the nozzle is concentrated at the center of the adhesive unit 350.

While FIGS. 7A and 7B illustrate an example of a manufacturing process for the adhesive unit formed on the first substrate, the same processing method may be used to form the adhesive unit on the outer edge of the second substrate.

The first nozzle 371 for forming the second portion corresponding to the inner side of the adhesive unit may further include a small amount of the plurality of additives 360. The first nozzle 371 may adjust the additives so that the amount of additives in the second portion corresponding to the inner side of the adhesive unit is larger than the amount of additives in a third portion corresponding to the outer side of the adhesive unit, to provide the effect illustrated in the FIG. 3D example.

While FIGS. 7A and 7B illustrate that the adhesive unit may be formed using the three nozzles 371, 372, 373 to generate the adhesive unit including the first, second, and third portions in the FIG. 2 example, in some embodiments, only two nozzles may be used to manufacture an adhesive unit having only a first portion and a second portion, as in the FIG. 4 example. For example, by performing a curing process after a plurality of additives is supplied into one of the two nozzles that is positioned closer to an organic light-emitting unit, and a curable resin and a plurality of additives are formed on a substrate, the adhesive unit of the OLED display device according to the example of FIG. 4 may be manufactured. In other words, as the plurality of additives is densely distributed in the inner portion of the adhesive unit, the concentration of the plurality of additives may gradually decrease from the inner portion to the outer portion.

Next, with reference to the FIG. 6 flowchart, an encapsulation unit may be formed inside the adhesive unit (operation S630). That is, the encapsulation unit may be formed in the inner portion of the first substrate or second substrate surrounded by the adhesive unit formed on the outer edge of the first substrate or second substrate, using, for example, one of screen printing, liquid dropping, and inkjet printing. For example, if the adhesive unit is formed on the outer edge of the first substrate, the adhesive unit may be formed to cover the organic light-emitting unit.

Finally, the first substrate and the second substrate may be bonded (operation S640). The first substrate and the second substrate may be caused to adhere to each other by the adhesive unit formed on the outer edge of the first substrate or second substrate.

According to the manufacturing method for the OLED display device illustrated in FIGS. 6 and 7A-7B, the organic light-emitting unit may be protected against laterally infiltrating moisture or oxygen, and delamination of the substrates from the adhesive unit may be reduced or minimized by manufacturing the OLED display device through the aforementioned processes, such that the plurality of additives are intentionally disposed to be densely distributed in a particular portion of the adhesive unit. Thus, defects in the OLED display device caused by moisture infiltration may be reduced, and the reliability and the lifespan of the OLED display device may be enhanced.

According to an embodiment, an OLED display device may include at least two regions, including a moisture barrier region and a delamination suppression region. The concentration of a plurality of additives may be higher in the moisture barrier region than in the delamination suppression region. In the OLED display device, the delamination suppression region may be positioned at the outermost portion of the adhesive unit. In addition, the width of the delamination suppression region may be greater than or equal to that of the moisture barrier region. In addition, the plurality of additives included in the moisture barrier region may be distributed throughout the moisture barrier region.

According to an embodiment, an OLED display device may include an organic light-emitting unit on a first substrate, an encapsulation unit covering the organic light-emitting unit, and a second substrate on the encapsulation unit. The OLED display device may further include an adhesive unit on the outer edges of the first substrate and the second substrate. The adhesive unit may surround the encapsulation unit, and may include a plurality of additives. In the OLED display device, the concentration of the plurality of additives may be higher in a particular portion of the adhesive unit than in another portion of the adhesive unit.

The OLED display device may have the highest concentration of the plurality of additives in the center portion of the adhesive unit. In the OLED display device, the concentration of the plurality of additives may gradually decrease from the center portion of the adhesive unit to the edge portion of the adhesive unit. The adhesive unit may include a first portion positioned at the center thereof; a second portion positioned on the inside of the first portion, closer to the organic light-emitting unit than the first portion; and a third portion positioned on the outside of the first portion, further from the organic light-emitting unit than the first portion.

At least 60 wt % of the total amount of the additives contained in the adhesive unit may be distributed in the first portion, such that infiltration of external moisture into the organic light-emitting unit is suppressed. The sum of a width of the second portion and a width of the third portion may be greater than or equal to 50% of the width of the adhesive unit so that delamination of at least one of the two substrates from the adhesive unit caused by moisture can be suppressed.

The width of the third portion may be greater than or equal to that of the second portion. The inner portion of the adhesive unit (closer to the organic light-emitting unit an outer portion of the adhesive unit) may have the highest concentration of the plurality of additives. The concentration of the plurality of the additives may gradually decrease from the inner portion of the adhesive unit to the outer portion of the adhesive unit. The adhesive unit may include a first portion neighboring the organic light-emitting unit and a second portion exposed outside, further from the organic light-emitting unit than the first portion.

At least 60 wt % of the total amount of the additives contained in the adhesive unit may be distributed in the first portion such that infiltration of external moisture into the organic light-emitting unit is suppressed. The width of the second portion may be greater than or equal to 50% of the width of the adhesive unit such that delamination of at least one of the two substrates from the adhesive unit caused by moisture can be suppressed.

In a method of manufacturing an OLED display device according to an embodiment, the operation of providing the adhesive unit may include curing the curable resin formed on the first substrate or second substrate using, e.g., heat or light. The plurality of nozzles may include three nozzles, and a plurality of additives may be provided in one of the three nozzles that is positioned at the center of the three nozzles. The plurality of nozzles may include two nozzles, and a plurality of additives may be provided in one nozzle that is positioned closer to the organic light-emitting unit, among the two nozzles.

According to embodiments, the organic light-emitting display device may effectively protect the organic light emitting unit against laterally infiltrating moisture or oxygen and reduce delamination of the substrates from the adhesive unit. In addition, according to embodiments, an organic light-emitting unit may be effectively protected against laterally infiltrating moisture or oxygen and detachment of a substrate from an adhesive unit may be minimized by distributing additives in the adhesive unit, such that the additives are more densely disposed in a particular portion of the adhesive unit. Further, by suppressing moisture infiltration caused by cracks and delamination of the adhesive unit, the reliability and lifespan of an OLED display device may be enhanced.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:

1. An organic light-emitting display device, comprising:
    an organic light-emitting unit between two substrates; and
    an adhesive unit configured to adhere the two substrates together, the adhesive unit comprising a resin as a base material, the resin comprising:
    a first region on an inner side of the adhesive unit and at a center of the adhesive unit;
    a second region on an inner side of the adhesive unit and closer to the organic light-emitting unit than the first region;
    a third region on an outer side of the adhesive unit and further from the organic light-emitting unit than the first region; and
    a plurality of additives distributed in the first region and the second region,
    wherein an amount of the plurality of additives of the first region is more than an amount of the plurality of additives of the second region or the third region, and
    wherein a width of the third region is greater than a width of the second region.

2. The organic light-emitting display device of claim 1, wherein:
    the at least two regions respectively correspond to:
        a moisture barrier region; and
        a delamination suppression region; and
    a concentration of the plurality of additives in the moisture barrier region is higher than a concentration of the plurality of additives in the delamination suppression region.

3. The organic light-emitting display device of claim 2, wherein the delamination suppression region is positioned on an outermost side of the adhesive unit.

4. The organic light-emitting display device of claim 2, wherein a width of the delamination suppression region is greater than or equal to a width of the moisture barrier region.

5. The organic light-emitting display device of claim 2, wherein the plurality of additives included in the moisture barrier region are distributed throughout the moisture barrier region.

6. The organic light-emitting display device of claim 1, wherein at least 60 wt % of a total amount of the additives contained in the adhesive unit is distributed in the first region.

7. The organic light-emitting display device of claim 6, wherein a sum of a width of the second region and a width of the third region is greater than or equal to 50% of a width of the adhesive unit.

8. The organic light-emitting display device of claim 7, the width of the third region is greater than or equal to the width of the second region.

9. An organic light-emitting display device, comprising:
    an organic light-emitting unit on a first substrate;
    an encapsulation unit configured to cover the organic light-emitting unit;
    a second substrate on the encapsulation unit; and
    an adhesive unit on outer edges of the first substrate and the second substrate, the adhesive unit surrounding the encapsulation unit, the adhesive unit comprising a base material different from a material of the encapsulation unit, the adhesive unit comprising a resin as the base material, the resin comprising:
    a first region on an inner side of the adhesive unit;
    a second region on an outer side of the adhesive unit; and
    a plurality of additives distributed in the first region and the second region,
    wherein an amount of the plurality of additives of the first region is more than an amount of the plurality of additives of the second region, and
    wherein a width of the second region is greater than a width of the first region.

10. The organic light-emitting display device of claim 9, wherein:
    the first region of the adhesive unit is a center portion of the adhesive unit; and
    a concentration of the plurality of additives is highest in the center portion of the adhesive unit.

11. The organic light-emitting display device of claim 10, wherein:
    the second region of the adhesive unit is an edge portion of the adhesive unit; and
    a concentration of the plurality of the additives gradually decreases from the center portion of the adhesive unit to the edge portion of the adhesive unit.

12. The organic light-emitting display device of claim 9, wherein a concentration of the plurality of additives is highest in an inner portion of the adhesive unit, the inner portion being closer to the organic light-emitting unit than an outer portion of the adhesive unit.

13. The organic light-emitting display device of claim 12, wherein the concentration of the plurality of the additives gradually decreases from the inner portion of the adhesive unit to the outer portion of the adhesive unit.

14. The organic light-emitting display device of claim 9, wherein the adhesive unit comprises:
    a first portion neighboring the organic light-emitting unit; and
    a second portion exposed outside, further from the organic light-emitting unit than the first portion.

15. The organic light-emitting display device of claim 14, wherein at least 60 wt % of a total amount of the additives contained in the adhesive unit is distributed in the first portion.

16. The organic light-emitting display device of claim 15, wherein a width of the second portion is greater than or equal to 50% of a width of the adhesive unit.

* * * * *